(12) United States Patent
Yao et al.

(10) Patent No.: US 10,276,657 B2
(45) Date of Patent: Apr. 30, 2019

(54) ISOLATION STRUCTURE FOR ACTIVE DEVICES

(71) Applicant: Taiwan Semiconductor Manufacturing Co., Ltd., Hsin-Chu (TW)

(72) Inventors: Fu-Wei Yao, Hsinchu (TW); Chun Lin Tsai, Hsin-Chu (TW); Jiun-Lei Jerry Yu, Zhudong Township (TW); Man-Ho Kwan, Kowloon (HK)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/703,084

(22) Filed: Sep. 13, 2017

(65) Prior Publication Data
US 2019/0081137 A1    Mar. 14, 2019

(51) Int. Cl.
| | | |
|---|---|---|
| *H01L 29/778* | (2006.01) | |
| *H01L 29/06* | (2006.01) | |
| *H01L 29/20* | (2006.01) | |
| *H01L 29/66* | (2006.01) | |
| *H01L 21/76* | (2006.01) | |
| *H01L 21/761* | (2006.01) | |

(52) U.S. Cl.
CPC ........ *H01L 29/0646* (2013.01); *H01L 21/761* (2013.01); *H01L 21/7605* (2013.01); *H01L 29/2003* (2013.01); *H01L 29/66462* (2013.01); *H01L 29/778* (2013.01)

(58) Field of Classification Search
CPC . H01L 29/0646; H01L 29/778; H01L 21/761; H01L 29/66462; H01L 29/2003; H01L 21/7605; H01L 29/0619–29/0623; H01L 29/063–29/0634; H01L 21/76216–21/76218; H01L 21/76237
See application file for complete search history.

(56) References Cited

U.S. PATENT DOCUMENTS

| | | | | |
|---|---|---|---|---|
| 2003/0015759 | A1* | 1/2003 | Davis | H01L 21/761 257/368 |
| 2005/0253191 | A1* | 11/2005 | Pendharkar | H01L 29/0847 257/335 |

* cited by examiner

*Primary Examiner* — Selim U Ahmed
(74) *Attorney, Agent, or Firm* — Eschweiler & Potashnik, LLC

(57) ABSTRACT

An isolation structure for active devices is provided. In some embodiments, the isolation structure is used in a transistor. The transistore includes a substrate having a first doping type. The transistor also includes a channel layer positioned over the substrate and comprising a first section and a second section. The transistor further includes an active layer positioned over the channel layer. The isolation structure includes a horizontal segment, a first vertical segment, and a second vertical segment. The horizontal segment is arranged below the second section of the channel layer and continuously extends between the first vertical segment and the second vertical segment. The isolation structure has a second doping type that is different than the first doping type.

20 Claims, 7 Drawing Sheets

ISOLATION STRUCTURE FOR ACTIVE DEVICES

BACKGROUND

Semiconductor devices based on silicon, such as transistors and photodiodes, have been the standard for the past three decades. However, semiconductor devices based on alternative materials are receiving increasing attention. For example, semiconductor devices based on gallium nitride (GaN) have found widespread use in high power applications. This is because the high electron mobility and low temperature coefficients of GaN allow it to carry large currents and support high voltages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
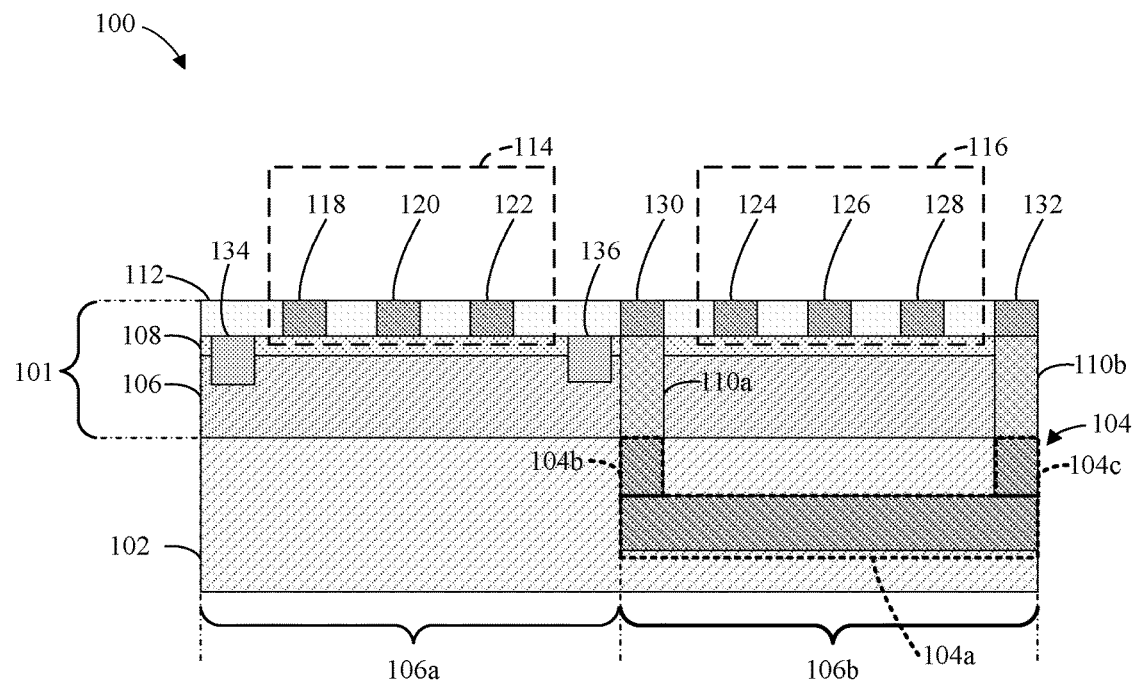
FIG. 1 illustrates a cross-sectional view of some embodiments of an isolation structure for active devices.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Multiple devices may share a semiconductor substrate. For example, a power semiconductor device is a semiconductor device used as a switch or rectifier in power electronics. However, a power semiconductor device having a high side and a low side switch on a shared semiconductor substrate is generally impractical because the state of one device affects the on-state resistance of the other device. In particular, the devices may suffer from cross-talk which impedes the functioning of each of the devices. Thus, sharing the substrate results in unstable device performance.

The devices may be insulated from each other by forming a physical gap between devices by etching trenches in the semiconductor substrate around the devices. However, this etching entails carving the trenches completely through the substrate to the surface of an insulating material. Forming gaps in the subsrate with the dimensions necessary to electrically isolate the devices is a challenging process that can damage the devices or the wafer.

The present disclosure pertains to structural arrangements in which devices of different characters can be monolithically integrated on the same semiconductor substrate using an isolation structure. The semiconductor substrate has a first doping type. For example, the semiconductor substrate may have a p-type doping. The semiconductor substrate has an isolation structure. The isolation structure has a second doping type that is different than the first doping type. For example, the isolation structure may be an n-type buried layer. The devices are arranged such that a first device overlies a first portion of the p-type substrate without the isolation structure and a second device overlies a second portion of the p-type substrate that does overlie the isolation structure.

Suppose, that as discussed above, the semiconductor is a p-type substrate and that the isolation structure provides electrical isolation. In some embodiments, the isolation affects the overlying layers of III-V materials. For example, a gallium nitride (GaN) transistor includes an epitaxial stack arranged over the substrate. In addition to the substrate and the isolation structure, the epitaxial stack further includes a GaN channel layer and an AlGaN active layer stacked in that order. The GaN channel layer and the AlGaN active layer define a heterojunction in which a two-dimensional electron gas (2-DEG) forms in the GaN channel layer. High temperature annealing after implantation of the isolation structure can be performed during the epitaxial growth of the GaN channel layer. The electrodes for the devices are formed over the active layer. In these embodiments, trenches, etched as through GaN vias (TGVs), facilitate the formation of the isolation structure, but etching through the substrate is unnecesary.

The difference in the doping types between the substrate and the isolation structure isolates the devices. Because the isolation structure is grown in the substrate, the substrate is not etched. Thereby, reducing the risk of etching damage to the substrate, but allowing the devices to be electrically isolated.

With reference to FIG. 1, a cross-sectional view 100 of some embodiments of an isolation structure for active devices. An epitaxial stack 101 is formed over a substrate 102. The substrate 102 has a first doping type. For example, the substrate 102 may be comprised of a p-type material. In some embodiments, the substrate 102 is a multilayer substate having a first substrate layer and a second substrate layer, both of the first doping type.

An isolation structure 104 is embedded within the substrate 102. The isolation structure 104 has a second doping type that is different than the first doping type. In some embodiments, the isolation structure 104 is an n-type buried layer. The difference between the first doping type and the second doping type form a junction that inhibits electrical carrier movement, and therefore, electrically isolates portions of the substrate 102 and the overlying epitaxial stack 101. As will be discussed below with respect to FIGS. 5-9, the isolation structure 104 is formed through epitaxial growth and implantation.

A channel layer 106 of the epitaxial stack 101 is arranged over the substrate 102. The channel layer 106 includes a 2-DEG within which a conductive channel is selectively formed. The 2-DEG has high mobility electrons that are not bound to any atoms and that are free to move within the 2-DEG. The channel layer 106 is typically undoped gallium nitride (GaN), but other group III-V materials are amenable. For example, the channel layer 106 may be indium gallium nitride (InGaN). The channel layer 106 may have a thickness of, for example, about 0.2-0.6 micrometers.

The channel layer 106 has a first section 106a and a second section 106b that are laterally separated. The isolation structure 104 has a horizontal segment 104a segment arranged below the second section 106b of the channel layer. Furthermore, the horizontal segment 104a extends horizontally and continuously through the substrate and is aligned between outer sidewalls of a first vertical segment 104b and a second vertical segment 104c. The first vertical segment 104b separates the first section 106a and the second section 106b of the channel layer 106. In some embodiments, the substrate 102 is arranged above and below the horizontal segment 104a of the isolation structure 104.

An active layer 108 is arranged over the channel layer 106. In some embodiments, the active layer 108 comprises a plurality of layers. In some embodiments, the active layer 108 has a thickness of 5-30 nanometers. The active layer 108 includes a material, typically a group III-V material, having a band gap unequal to that of the channel layer 106. For example, where the channel layer 106 is GaN, the active layer 108 may be aluminum gallium nitride (AlGaN). AlGaN has a band gap of approximately 4 electron volts (eV), whereas GaN has a band gap of approximately 3.4 eV.

A first contact 110a and a second contact 110b are disposed within the channel layer 106 and the active layer 108. The first contact 110a is arranged over the first vertical segment 104b and the second contact 110b is arranged over the second vertical segment 104c. In some embodiments, the first contact 110a contacts the first vertical segment 104b and the second contact 110b contacts the second vertical segment 104c.

A dielectric layer 112 is arranged over the active layer 108. The dielectric layer 112 may be, for example, an oxide, such as silicon dioxide, or a nitride, such as silicon nitride. A plurality of device electrodes corresponding to a first device 114 and a second device 116 may be arranged within the dielectric layer 112. The first device 114 includes a first source electrode 118, a first gate electrode 120, and a first drain electrode 122. The first source electrode 118 and the first drain electrode 122 are arranged on opposing sides of the first gate electrode 120. The second device 116 includes a second source electrode 124, a second gate electrode 126, and a second drain electrode 128. The second source electrode 124 and the second drain electrode 128 are arranged on opposing sides of the second gate electrode 126.

The first source electrode 118, the first gate electrode 120, the first drain electrode 122, the second source electrode 124, the second gate electrode 126, and the second drain electrode 128 are collectively referred to the electrodes for convenience. The electrodes extend through the dielectric layer 112 to the active layer 108. The electrodes are comprised of a conductive material, such as metal or doped polysilicon. The electrodes of the first device 114 are separated from the electrodes of the second device 116 by a first body contact 130. A second body contact 132 is separated from the first body contact 130 by the second device 116. The first body contact 130 is formed over the first contact 110a and the second body contact 132 is formed over the second contact 110b. The first body contact 130 and/or the second body contact 132 are configured to connect the first device 114 to the bulk (e.g., the isolation structure 104 within the substrate 102). For example, the first body contact 130 may connect the first source electrode 118 of the first device 114 to the bulk to reverse bias the p-n junction between the isolation structure 104 and the substrate 102 and provide for junction isolation of the first device 114. In some embodiments, the first body contact 130 may couple the bulk to the second source electrode 124 of the second device 116 by way of one or more overlying interconnect layers.

In some embodiments, isolation implantation regions may be arranged within the channel layer 106 and the active layer 108. The first isolation implantation region 134 may be separated from the second isolation implantation region 136 by the first device layer 114. The first isolation implantation region 134 and the second isolation implantation region 136 comprise doped regions that provide for lateral isolation between the first device 114 and the first contact 110a. In some embodiments, the channel layer 106 and the active layer 108 may have a doping type that is different than a doping type of the first isolation implantation region 134 and the second isolation implantation region 136.

The isolation structure 104 electrically isolates the first device 114 from the second device 116. Because the first device 114 is positioned above a portion of the substrate 102 without the isolation structure 104, and the second device 116 is positioned over a portion of the substrate 102 having the isolation structure 104, the first device 114 and the second device 116 are electrically isolated. Accordingly, in one embodiment, the first device 114 is a low side power switch and the second device 116 is a high side power switch even though the first device 114 and the second device 116 share a substrate 202 that has not been etched.

Figure 2:
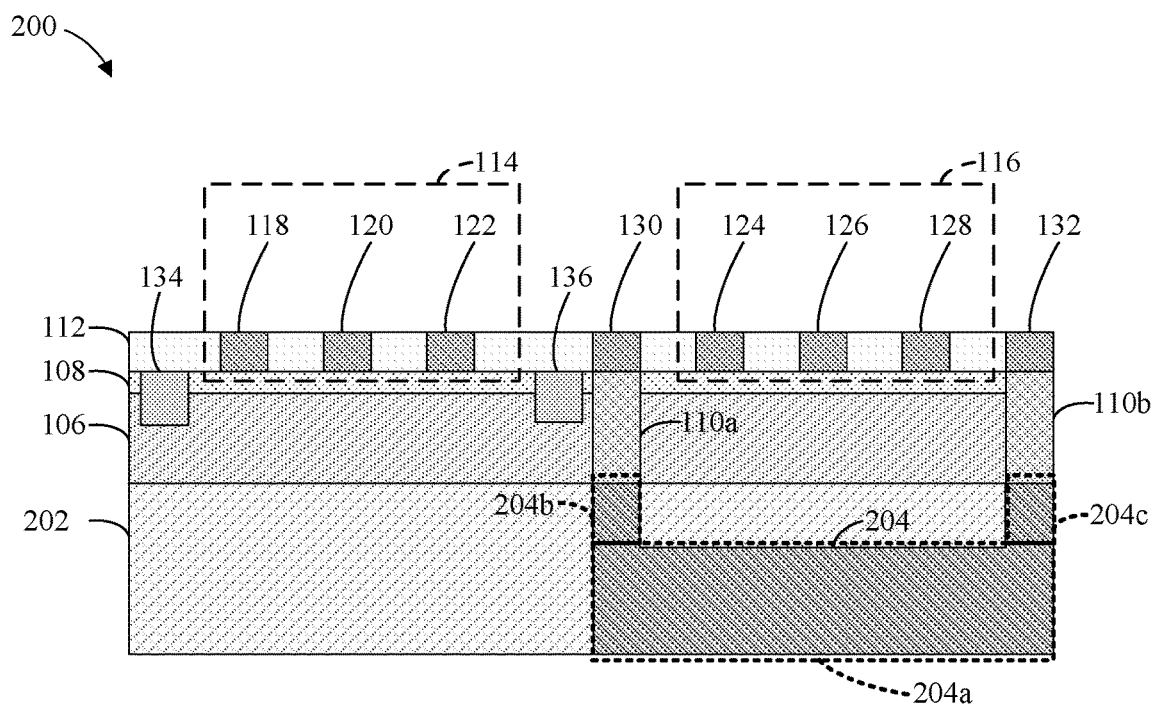
FIG. 2 illustrates a cross-sectional view of other embodiments of an isolation structure embedded in a substrate.

FIG. 2 illustrates a cross-sectional view 200 of other embodiments of an isolation structure 204 extending to the lowermost surface of the substrate. The isolation structure 204 is similar to the isolation structure 104 described with respect to FIG. 1. For example, the isolation structure 204 has a different doping type than the substrate 102.

Like the isolation structure 104 of FIG. 1, the isolation structure 204 has a horizontal segment 204a that extends horizontally and continuously between a first vertical segment 204b and a second vertical segment 204c. Here, the substrate 202 is arranged above the horizontal segment 204a of the isolation structure 204, but the substrate 202 is not arranged below the horizontal segement 204a. Accordingly, the isolation structure 204 extends to the bottom of the substrate 202.

Figure 3:
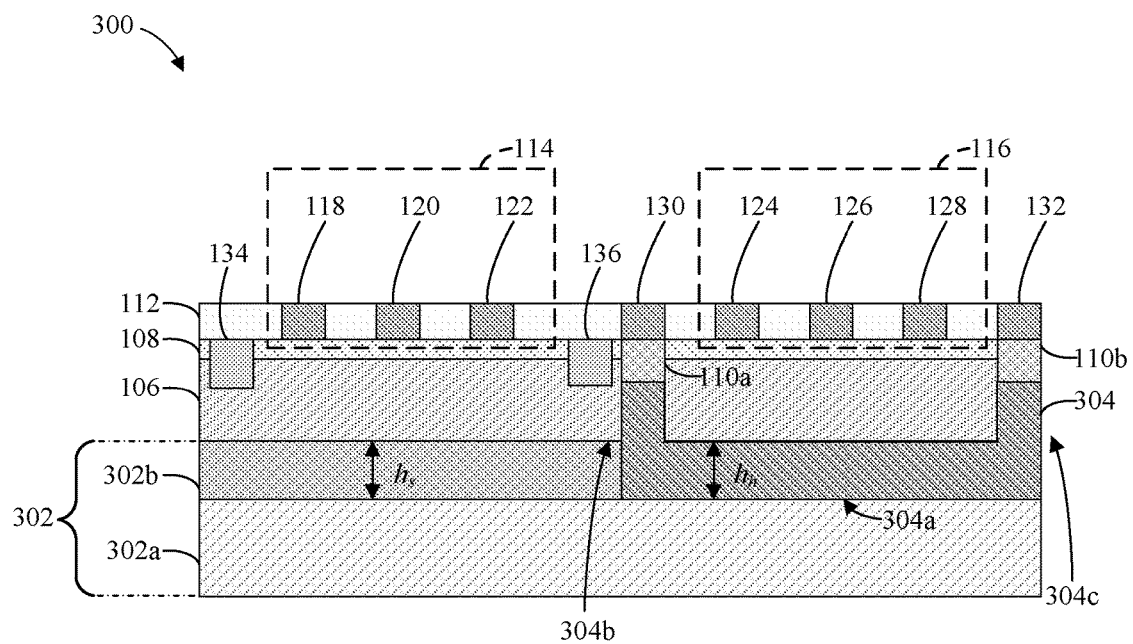
FIG. 3 illustrates a cross-sectional view of embodiments of an isolation structure embedded in a multilayer substrate.

FIG. 3 illustrates a cross-sectional view 300 of other embodiments of an isolation structure 304 being embedded in a multilayer substrate. The isolation structure 304 is similar to the isolation structure 104 described with respect to FIG. 1. For example, the isolation structure 304 has a different doping type than the multilayer substrate 302. The multilayer substrate 302 includes a first substrate layer 302a and a second substrate layer 302b. Both the first substrate layer 302a and a second substrate layer 302b share the first doping type. In one embodiment, the first substrate layer 302a and the second substrate layer 302b may comprise the same or different p-type materials. The p-type materials of the multilayer substrate 302 may be, for example, silicon carbide, silicon, or sapphire.

Here, the lowermost surface of the isolation structure 304 is aligned with the boundary between the first substrate layer 302a and the second substrate layer 302b. In other embodiments, the lowermost surface of the isolation structure 304 may be embedded within the first substrate layer 302a or the a second substrate layer 302b. Likewise, the uppermost surface of the horizontal segment 304a may be embedded within the first substrate layer 302a or the second substrate layer 302b. In some embodiments, the height, $h_s$, of the second substrate layer 302b is substantially the same as the the height, $h_h$ of the horizontal segment 304a. The isolation structure also includes a first vertical segment 304b and the second vertical segment 304c.

With reference to FIGS. 4-12, cross-sectional views of some embodiments of an isolation structure for active devices at various stages of manufacture are provided.

Figure 4:
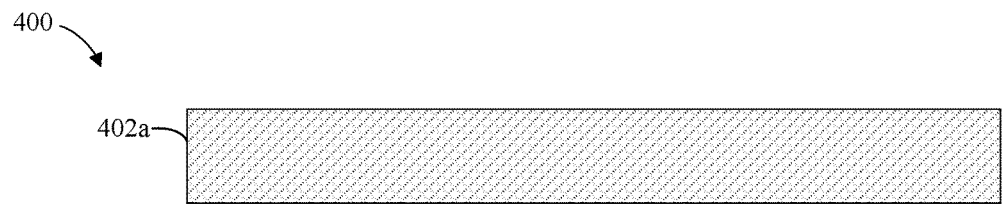
FIGS. 4-12 illustrate a series of cross-sectional views of some embodiments of a semiconductor structure having an isolation structure at various stages of manufacture.

As shown in cross-sectional view 400 of FIG. 4, a substrate a first substrate layer 402a is provided. In some embodiments, the first substrate layer 402a has a first doping type. In some embodiments, the first doping type is p-type. Further, the first substrate layer 402a may be, for example, a silicon carbide substrate, a silicon substrate, or a sapphire substrate, and/or may have, for example, a thickness of between about 800-2000 nanometers.

Figure 5:
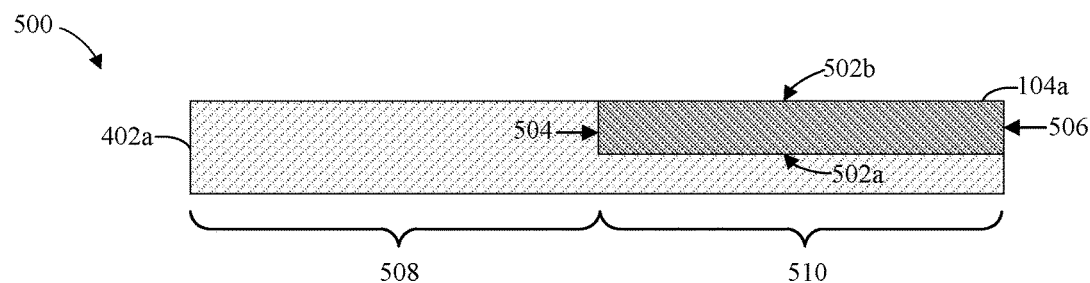

As shown in cross-sectional view 500 of FIG. 5, a horizontal segment 104a is formed in the first substrate layer 402a. In some embodiments, the horizontal segment 104a is an epitaxial layer grown over the first substrate layer 402a. For example, the horizontal segment 104a can be grown through metal organic chemical vapor deposition. The deposition reduces the need for implanting the isolation structure into the first substrate layer 402a which can damage the substrate and compromise the growth of subsequent layers. In other embodiments, the first substrate layer 402a is selectively etched to form a recess, which is subsequently filled with the horizontal segment 104a. In another embodiment, the horizontal segment 104a is formed in the first substrate layer 402a by implanting a dopant species into the first substrate layer 402a.

The horizontal segment 104a has a lowermost boundary 502a and a first upper boundary 502b. The horizontal segment 104a has a first segment sidewall 504 and a second segment sidewall 506. The horizontal segment 104a has a second doping type that is different than the first doping type of the first substrate layer 402a. In the example given above, the first substrate layer 402a is a p-type material. Accordingly, the horizontal segment 104a is an n-type material. Conversely, should the first substrate layer 402a be an n-type material, the horizontal segment 104a would be a p-type material.

The difference in doping types allows the isolation structure to electrically isolate the device overlying the isolation structure from any device not overlying the isolation structure, thereby allowing devices to share the same substrate allowing for high-scale integration of devices, paving the way for a smart power platform on a single chip.

Figure 6:
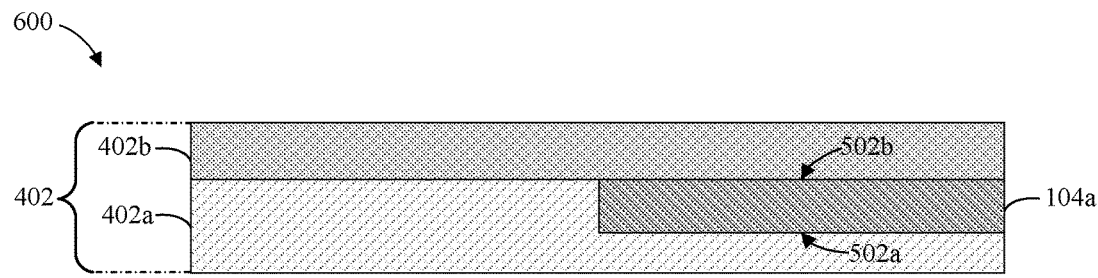

As shown in cross-sectional view 600 of FIG. 6, a second substrate layer 402b is formed over the first substrate layer 402a. The second substrate layer 402b has the same doping type as the first substrate layer 402a. In the example given above, the first substrate layer 402a is a p-type material. Accordingly, the second substrate layer 402b is a p-type material as well. Should the first substrate layer 402a be an n-type material, the second substrate layer 402b would be an n-type material also. Together, the first substrate layer 402a and the second substrate layer 402b form the substrate 402.

Figure 7:
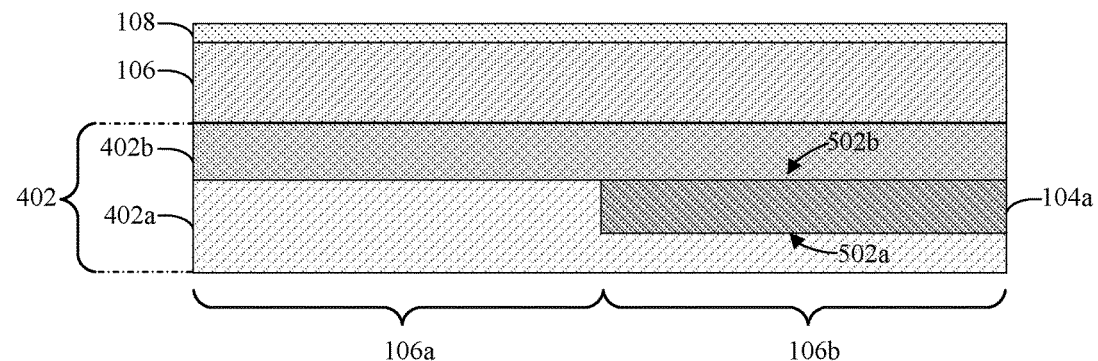

As shown in cross-sectional view 700 of FIG. 7, a channel layer 106 and an active layer 108 are formed over the substrate 402. The channel layer 106 is formed over the substrate 402. The channel layer 106 has a first section 106a and a second section 106b. The horizontal segment 104a is arranged below the second section 106b of the channel layer 106. The channel layer 106 is typically an undoped group III-V layer, such as undoped GaN layer, however the channel layer 106 may also comprise a doped group III-V layer in some embodiments. The channel layer 106 may be formed using any suitable deposition technique, such as MOCVD, MBE, or HVPE, and is typically formed at about 950-1050 degrees Celsius under a pressure of 100 mbar to 650 mbar. In some embodiments, a high temperature anneal is performed after the forming of the at least one implantation region during growth of the channel layer. Further, the channel layer 106 is typically formed with a thickness of about 0.2-0.6 micrometers.

The active layer 108 is formed over the channel layer 106. In some embodiments, the process for forming the active layer 108 includes forming a group III-V layer over the channel layer 106. The group III-V layer may be, for example, an AlGaN or InAlGaN layer, typically having a thickness of about 5-30 nanometers. The group III-V layer may be formed using any suitable deposition technique, such as MOCVD, MBE, or HVPE, and is typically formed at a temperature of about 1000-1100 degrees Celsius, under a pressure of 50 mbar to 100 mbar. For example, the active layer 108 may be an AlGaN layer.

Figure 8:
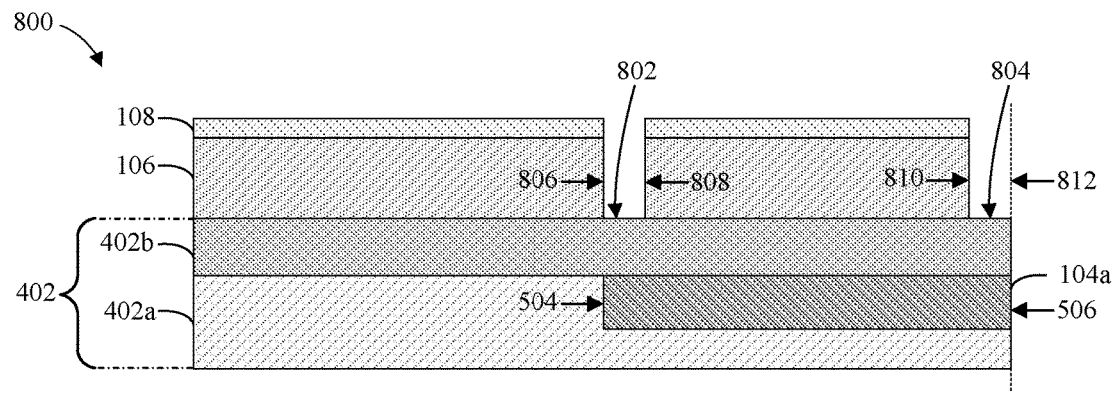

As shown in cross-sectional view 800 of FIG. 8, parts of the channel layer 106 and the active layer 108 are selectively removed to form one or more trenches extending through the channel layer 106 and the active layer 108. For example, a first trench 802 and a second trench 804 are formed in the channel layer 106 and the active layer 108. Forming the first trench 802 and the second trench 804 may comprise performing one or more etch operation to the channel layer 106 and the active layer 108.

In some embodiments, the first trench 802 and the second trench 804 are formed over the ends of the horizontal segment 104a. The first trench 802 is defined by a first sidewall 806 and a second sidewall 808. The second trench 804 is defined by a first sidewall 810 and a second sidewall edge 812. In some embodiments, the first segment sidewall 504, of the horizontal segment 104a, and the first sidewall 806, of the first trench 802, may be generally aligned. Likewise, the second segment sidewall 506, of the horizontal segment 104a, and the second sidewall edge 812, of the second trench 804, may be generally aligned.

The width of the first trench 802 corresponds to the distance between the first sidewall 806 and the second sidewall 808. Similarly, the width of the second trench 804 corresponds to the distance between the first sidewall 810 and the second sidewall edge 812. The widths of the first trench 802 and the second trench 804 may be based, at least in part, on the desired width of the first contact 110a and the second contact 110b, respectively, or the first body contact 130 or the second body contact 132, respectively.

Suppose the substrate 402 is comprised of silicon, the channel layer 106 is comprised of GaN and the active layer 108 is comprised of the AlGaN, as discussed above. The GaN is challenging to etch through and there is low selectivity between GaN and silicon. However, here the first trench 802 and the second trench 804 do not substantially extend into the substrate 402 is not etched.

Figure 9:
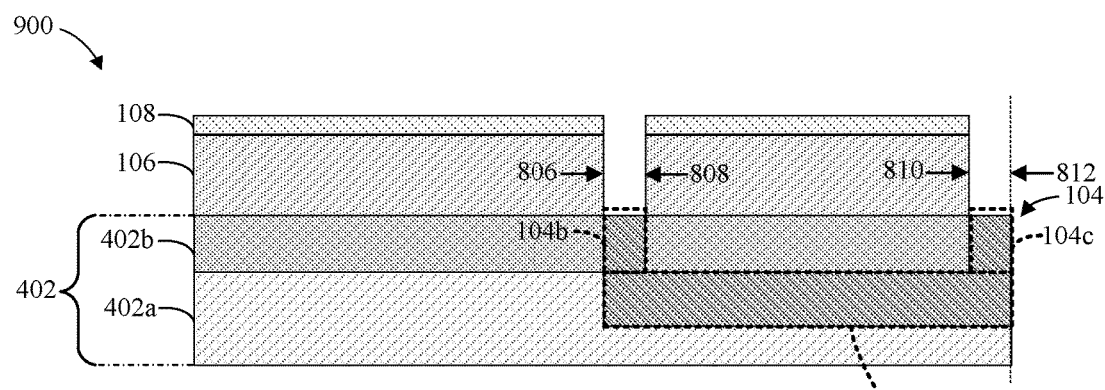

As shown in cross-sectional view 900 of FIG. 9, a first vertical segment 104b and a second vertical segment 104c are formed in the second substrate layer 402b. The first vertical segment 104b and the second vertical segment 104c may be formed be implanting a dopant species into the second substrate layer 402b and extend from the uppermost surface of the substrate 402 to the horizontal segment 104a. In some embodiments, a high temperature anneal may be performed after implantation of the dopant species. In some embodiments, the implantation may be performed prior to formation of the channel layer 106 and the high temperature anneal may be performed during formation of the channel layer 106.

In some embodiments, a width of the first vertical segment 104b corresponds to the distance between the first sidewall 806 and the second sidewall 808. Similarly, the width of the second vertical segment 104c may corresponds to the distance between the first sidewall 810 and the second sidewall edge 812. In other embodiments, widths of the first vertical segment 104b and the second vertical segment 104c may be larger than the distance between the first sidewall 806 and the second sidewall 808 and the distance between the first sidewall 810 and the second sidewall edge 812 due to diffusion of implanted dopants (e.g., during the high temperature anneal).

The first vertical segment 104b and the second vertical segment 104c have a same doping type as the horizontal segment 104a. For example, if the horizontal segment 104a is n-type doped than the first vertical segment 104b and the second vertical segment 104c are also n-type doped. Accordingly, together the horizontal segment 104a, the first vertical segment 104b, and the second vertical segment 104c form the isolation structure 104. Accordingly, the isolation structure 104 is formed through epitaxial growth and implantation.

Figure 10:
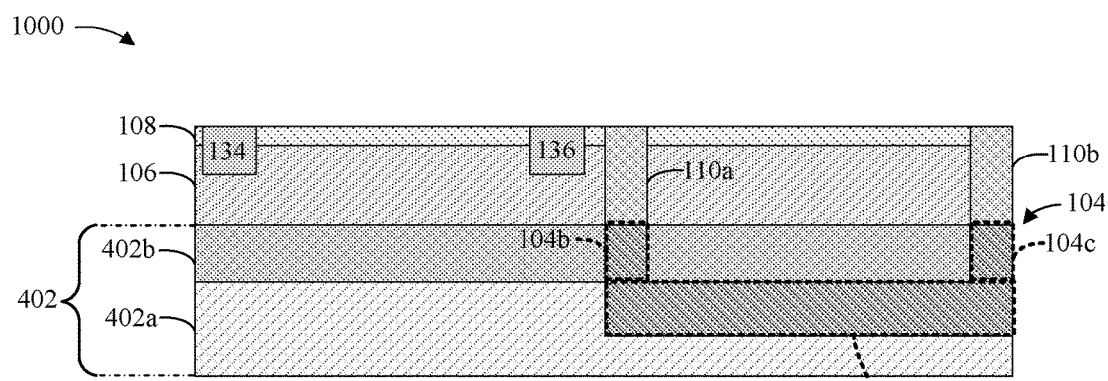

As shown in cross-sectional view 1000 of FIG. 10, a first contact 110a is formed over the first vertical segment 104b and a second contact 110b is formed over the second vertical segment 104c. The first contact 110a and the second contact 110b is formed from a conductive material, such as, titanium nitride (TiN) or tantalum nitride (TaN), a metal (e.g., titanium (Ti) or tantalum (Ta) copper), etc. In some embodiments, excess material of the first contact 110a and the second contact 110b is planarized to be coplanar with an uppermost surface of the active layer 108. In some embodiments, the planarization may be performed using a chemical mechanical planarization (CMP) process.

Additionally, a first isolation implantation region 134 and a second isolation implantation region 136 may be formed by doping regions of the channel layer 106 and the active layer 108. The first isolation implantation region 134 and the second isolation implantation region 136 have a different doping type than the channel layer 106 and the active layer 108.

Figure 11:
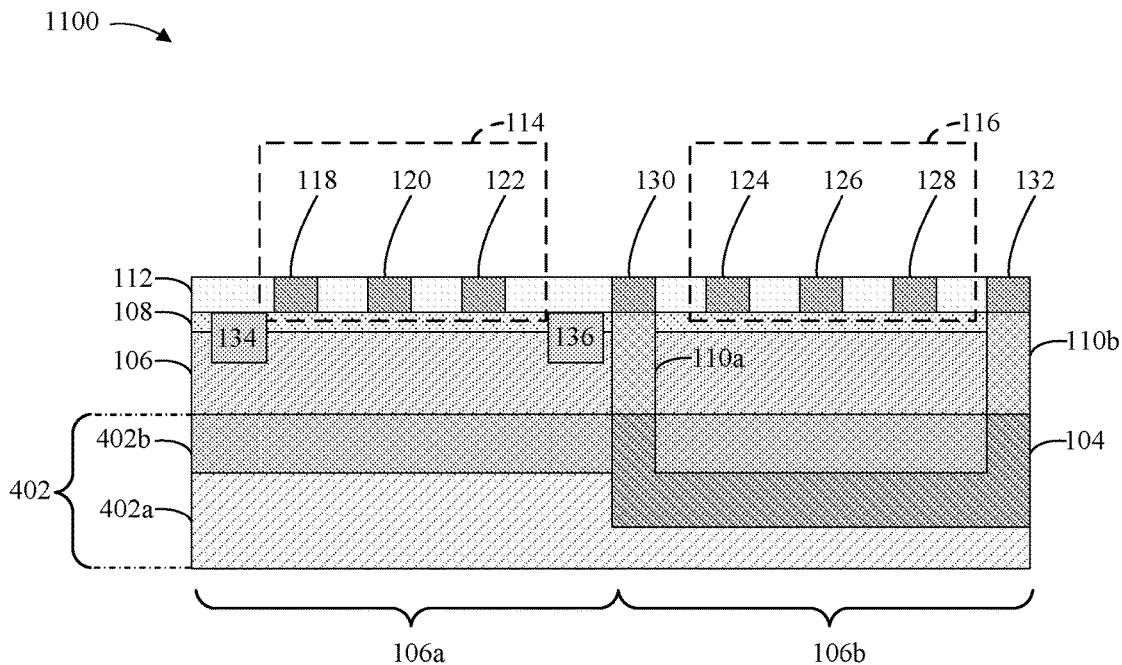

As shown in cross-sectional view 1100 of FIG. 11, the first device 114 and the second device 116 are formed during front-end of line (FEOL) processing. Device structures formed during FEOL processing can include source regions, drain regions, and gate electrodes.

As shown in cross-sectional view 1200 of FIG. 12, back end of line (BEOL) processing is used to form an interconnect structure that couples the devices to one another or another wafer, chip, or board, as will be described in more detail below. While described together, the FEOL processing and BEOL processing may be performed to the exclusion of the other.

Returning to FIG. 11, the electrodes are formed during FEOL processing. The electrodes are formed in a dielectric layer 112 from a conductive material. For example, the first source electrode 118, the first gate electrode 120, and the first drain electrode 122 of the first device 114 are formed to be in ohmic contact with contacts 110a and/or 110b. In one embodiment, in an on-state, a positive voltage is applied to the first drain electrode 122, which promotes the flow of electrons from the first source electrode 118, through the active layer 108, to the first drain electrode 122. In an off-state, a negative voltage is applied to the first gate electrode 120, which repels electrons to create a discontinuity in the active layer 108.

The first device 114 is formed over the first section 106a of the channel layer 106 and the second device 116 is formed over the second section 106b of the channel layer 106. As discussed above, the difference in the doping types between the substrate 402 and the second doped region 510 isolates the first device 114 from the second device 116. The first isolation implantation region 134 may be separated from the second isolation implantation region 136 by the first device layer 114. The doping provides lateral isolation between devices and contacts. For example, the second isolation implantation region 136 isolates the first device 114 and the first contact 110a.

Figure 12:
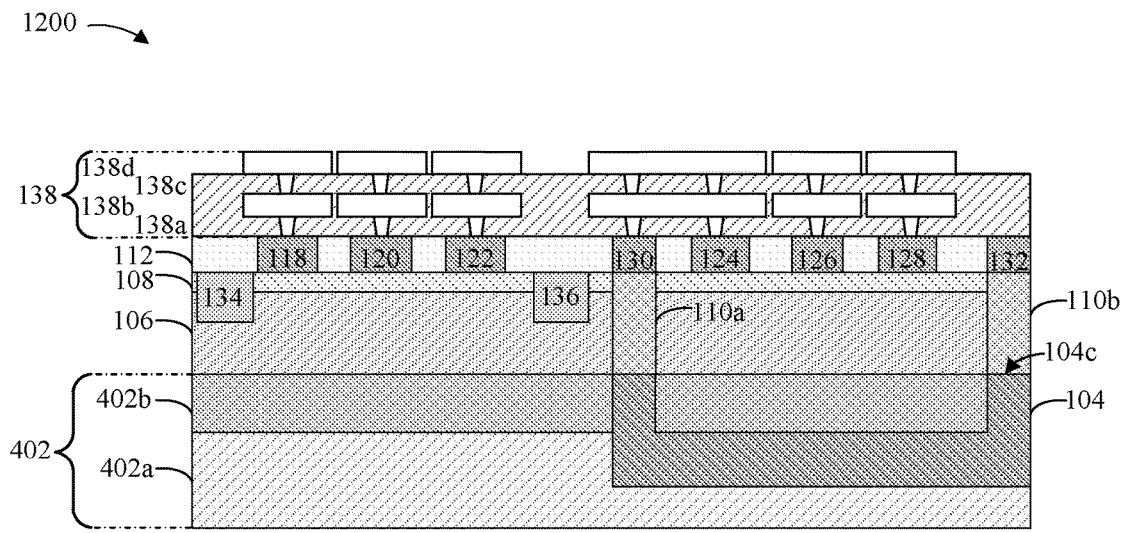

As shown in cross-sectional view 1200 of FIG. 12, an interconnect structure 138 is formed. The interconnect structure 138 includes a plurality of metallization layers in an interlayer dielectric (ILD) layers. In particular, the metallization layers are stacked between the ILD layers. The metallization layers are electrically coupled to one another by vias. For example, the metallization layer includes a first line layer 138b separated from the electrodes by first via layer 138a. A second metal line layer 138d is separated from the first line layer 138b by a second via layer 138c. While the interconnect structure 138 is electrically connected to the first device 114 and the second device 116, the first device 114 and the second device 116 are electrically isolated from each other by the isolation structure 104. Therefore, the first device 114 and the second device 116 are electrically isolated without etching the substrate 402.

Figure 13:
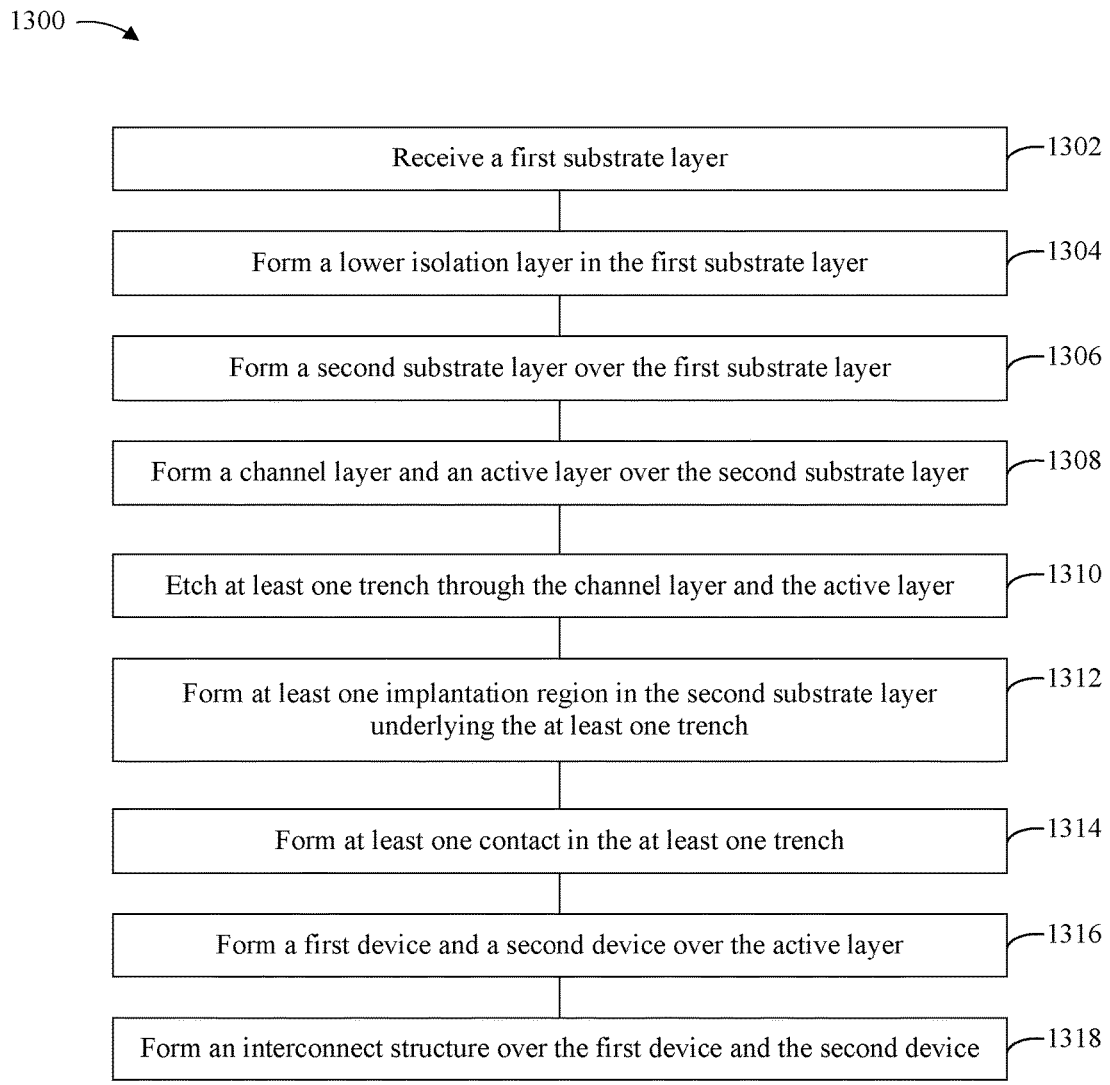
FIG. 13 illustrates a flow diagram of some embodiments of a method of manufacturing an isolation structure for active devices in accordance with FIGS. 4-12.

With reference to FIG. 13, a flowchart of some embodiments of the method of FIGS. 4-12 is provided. FIG. 13 shows some embodiments of a flow diagram of a method 1300 of forming an isolation structure for active devices. Although method 1300 is described in relation to FIGS. 4-12, it will be appreciated that the method 1300 is not limited to such structures disclosed in FIGS. 4-12, but instead may stand alone independent of the structures disclosed in FIGS. 4-12. Similarly, it will be appreciated that the structures disclosed in FIGS. 4-12 are not limited to the method 1300, but instead may stand alone as structures independent of the method 1300. Also, while disclosed methods (e.g., method 1300) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1302, a first substrate layer 402a is received. See, for example, FIG. 4.

At 1304, a horizontal segment 104a is formed in or over the first substrate layer 402a. The horizontal segment 104a is doped to have a different doping type than that of the first substrate layer 402a. For example, if the first substrate layer 402a is p-type, then the horizontal segment 104a is n-type. See, for example, FIG. 5.

At 1306, a second substrate layer 402b is formed over the first substrate layer 402a. The second substrate layer 402b has the same doping type as the first substrate layer 402a. For example, if the first substrate layer 402a is p-type than the second substrate layer 402b is also p-type. See, for example, FIG. 6.

At 1308, a channel layer 106 and an active layer 108 are formed over the second substrate layer 402b. In some embodiments, a high temperature anneal is performed after the forming of the at least one implantation region during growth of the channel layer 106. See, for example, FIG. 7.

At 1310, a first trench 802 and a second trench 804 are formed to extend through the channel layer 106 and the active layer 108. See, for example, FIG. 8.

At 1312, a first vertical segment 104b and the second vertical segment 104c are formed in the second substrate layer 402b underlying a first trench 802 and the second trench 804. See, for example, FIG. 9.

At 1314, a first contact 110a and a second contact 110b are formed in the first trench 802 and the second trench 804, respectively. See, for example, FIG. 10.

At 1316, a first device 114 and a second device 116 are formed over the active layer 108 by depositing conductive material to form electrodes. See, for example, FIG. 11.

At 1318, an interconnect structure 138 is formed and patterned over the first device 114 and the second device 116. See, for example, FIG. 12.

While the flowchart of FIG. 13 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Thus, as can be appreciated from above, the present disclosure provides a transistor comprising a substrate having a first doping type. The transistor also includes a channel layer positioned over the substrate and comprising a first section and a second section. The transistor further includes an active layer positioned over the channel layer. The transistor includes an isolation structure comprising a horizontal segment, a first vertical segment, and a second vertical segment. The horizontal segment is arranged below the second section of the channel layer and continuously extends between the first vertical segment and the second vertical segment. The isolation structure has a second doping type that is different than the first doping type.

The present disclosure further provides a transistor having a multilayer substrate having a first substrate and a second substrate arranged over the first substrate. The multilayer substrate has a first doping type. A gallium nitride (GaN) channel layer is positioned over the second substrate. An aluminum gallium nitride (AlGaN) active layer is positioned over the channel layer. An isolation structure comprises a horizontal segment, a first vertical segment, and a second vertical segment. The horizontal segment is arranged in the first substrate layer below the second section of the channel layer. Furthermore, the horizontal segment continuously extends between the first vertical segment and the second vertical segment. The isolation structure has a second doping type that is different than the first doping type.

In some embodiments, a method for manufacturing a transistor is provided. The method includes forming a first substrate layer having a first doping type. A horizontal segment layer is formed in or over the first substrate layer. The horizontal segment layer has a second doping type. A second substrate layer is formed on the first substrate layer. The second substrate layer has the first doping type. The method includes forming a channel layer over the second substrate layer, and forming an active layer over the channel layer. The method further includes etching at least one trench extending through the channel layer and the active layer. At least one vertical segment is formed in the second substrate layer underlying the at least one trench. The method also includes forming at least one contact in the at least one trench. Finally, the method further includes forming a first device and a second device over the first substrate layer and that the second device is formed over the isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor comprising:
   a substrate having a first doping type;
   a channel layer positioned over the substrate and comprising a first section and a second section, wherein the channel layer is comprised of a first material;
   an active layer positioned over the channel layer, wherein the active layer is comprised of a second material different than the first material; and
   an isolation structure comprising a horizontal segment, a first vertical segment, and a second vertical segment, wherein the horizontal segment is arranged below the second section of the channel layer and continuously extends between the first vertical segment and the second vertical segment, and wherein the isolation structure has a second doping type that is different than the first doping type.

2. The transistor of claim 1, wherein a first contact and a second contact extend through the channel layer and the active layer to respectively contact the first vertical segment and the second vertical segment.

3. The transistor of claim 1, wherein a topmost surface of the channel layer is in contact with a bottommost surface of the active layer.

4. The transistor of claim 1, wherein the first vertical segment separates the first section of the channel layer from the second section of the channel layer.

5. The transistor of claim 1, wherein a first contact and a second contact are disposed within the channel layer and the active layer, wherein the first contact is arranged over the first vertical segment and the second contact is arranged over the second vertical segment.

6. The transistor of claim 1, wherein the second material includes a group III-V material and the first material has a band gap unequal to that of the second material.

7. The transistor of claim 1, wherein a top surface of the isolation structure is below a top surface of the channel layer.

8. A transistor comprising:
a multilayer substrate having a first substrate layer and a second substrate layer arranged over the first substrate layer, wherein the multilayer substrate has a first doping type;
a channel layer positioned over the second substrate layer comprising a first section and a second section, wherein the channel layer is comprised of gallium nitride (GaN);
an active layer positioned over the channel layer, wherein the active layer is comprised of aluminum gallium nitride (AlGaN); and
an isolation structure comprising a horizontal segment, a first vertical segment, and a second vertical segment, wherein the horizontal segment is arranged in the first substrate layer below the second section of the channel layer, wherein the horizontal segment continuously extends between the first vertical segment and the second vertical segment, and wherein the isolation structure has a second doping type that is different than the first doping type.

9. The transistor of claim 8, wherein a portion of the multilayer substrate extends between the first vertical segment and the second vertical segment over the horizontal segment.

10. The transistor of claim 8, wherein the first vertical segment separates the first section of the channel layer from the second section of the channel layer.

11. The transistor of claim 8, wherein a first contact and a second contact are disposed within the channel layer and the active layer, wherein the first contact is arranged over the first vertical segment and the second contact is arranged over the second vertical segment.

12. The transistor of claim 8, wherein the first doping type is p-type and the second doping type is n-type.

13. The transistor of claim 12, wherein p-type materials of the first doping type may be, for example, silicon carbide, silicon, or sapphire.

14. The transistor of claim 11, wherein sidewalls of the first contact are aligned with sidewalls of the first vertical segment, and wherein sidewalls of the second contact are aligned with sidewalls of the second vertical segment.

15. A transistor comprising:
a substrate comprising a first semiconductor material having a first doping type;
a first layer arranged over the substrate and comprising a second semiconductor material having a first section and a second section laterally separated from the first section, wherein a topmost surface of the first layer is disposed vertically above a top surface of the substrate;
a second layer arranged over the first layer and comprising a third section laterally separated from a fourth section, wherein a bottommost surface of the second layer is in contact with the topmost surface of the first layer;
a high side power switch arranged within the third section of the second layer;
a low side power switch arranged within the fourth section of the second layer; and
an isolation structure arranged within the substrate and having a second doping type that is different than the first doping type, wherein the isolation structure has a horizontal segment, a first vertical segment, and a second vertical segment that is laterally between the first section and the second section.

16. The transistor of claim 15, wherein a first contact and a second contact directly contact the isolation structure along an interface that is substantially aligned with the top surface of the substrate.

17. The transistor of claim 15, wherein the second layer comprises a material that is different than the first semiconductor material and the second semiconductor material.

18. The transistor of claim 15, further comprising:
a first contact and a second contact disposed within the first layer and the second layer, wherein the first contact and second contact extend from an upper surface of the substrate to an upper surface of the second layer, and wherein the first contact is arranged over the first vertical segment and the second contact is arranged over the second vertical segment.

19. The transistor of claim 18, wherein sidewalls of the first contact are aligned with sidewalls of the first vertical segment, and wherein sidewalls of the second contact are aligned with sidewalls of the second vertical segment.

20. The transistor of claim 19, further comprising:
a dielectric layer over the second layer, wherein a source electrode, a gate electrode, and a drain electrode are disposed within the dielectric layer,
wherein outermost sidewalls of the source electrode, the gate electrode, and the drain electrode are within inner sidewalls of the first contact and the second contact.

* * * * *